(12) United States Patent
Yang et al.

(10) Patent No.: US 10,216,344 B2
(45) Date of Patent: Feb. 26, 2019

(54) IN-CELL TOUCH PANEL, METHOD FOR DRIVING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Hailin Xue, Beijing (CN); Xiaochuan Chen, Beijing (CN); Haisheng Wang, Beijing (CN); Weijie Zhao, Beijing (CN); Yingming Liu, Beijing (CN); Xiaoliang Ding, Beijing (CN); Hongjuan Liu, Beijing (CN); Changfeng Li, Beijing (CN); Pengpeng Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/502,601

(22) PCT Filed: Aug. 9, 2016

(86) PCT No.: PCT/CN2016/094144
§ 371 (c)(1),
(2) Date: Feb. 8, 2017

(87) PCT Pub. No.: WO2017/071366
PCT Pub. Date: May 4, 2017

(65) Prior Publication Data
US 2018/0224959 A1 Aug. 9, 2018

(30) Foreign Application Priority Data

Oct. 26, 2015 (CN) .......................... 2015 1 0702597

(51) Int. Cl.
*G06F 3/041* (2006.01)
*G06F 3/044* (2006.01)
(Continued)

(52) U.S. Cl.
CPC ............ *G06F 3/044* (2013.01); *G06F 3/0412* (2013.01); *G06F 3/0416* (2013.01);
(Continued)

(58) Field of Classification Search
None
See application file for complete search history.

(56) References Cited

U.S. PATENT DOCUMENTS 9,069,205 B2   6/2015  Jiang et al.
2010/0020041 A1  1/2010  Park et al.
(Continued)

FOREIGN PATENT DOCUMENTS

CN    103076935 A    5/2013
CN    103226423 A    7/2013
(Continued)

OTHER PUBLICATIONS

PCT International Search Report and Written Opinion dated Oct. 31, 2016, Application No. PCT/CN2016/094144, 14 pages.

*Primary Examiner* — Carl Adams
(74) *Attorney, Agent, or Firm* — Brooks Kushman P.C.

(57) ABSTRACT

An in-cell touch panel, a method for driving the same, and a display device are provided. A plurality of first electrode plates is multiplexed as a pressure detection electrode which forms a capacitor with a conductive layer under the base substrate. When the pressure detection electrode is pressed,
(Continued)

a distance between the pressure detection electrode and the conductive layer and thereby a capacitance therebetween change.

18 Claims, 5 Drawing Sheets

(51) Int. Cl.
*H01L 27/32* (2006.01)
*H01L 51/52* (2006.01)

(52) U.S. Cl.
CPC ........ *H01L 27/323* (2013.01); *H01L 51/5284* (2013.01); *G06F 2203/04105* (2013.01)

(56) References Cited

U.S. PATENT DOCUMENTS

| | | | |
|---|---|---|---|
| 2014/0118298 A1* | 5/2014 | Han | G06F 3/044 345/174 |
| 2014/0326968 A1* | 11/2014 | Lee | H01L 27/323 257/40 |
| 2016/0179276 A1* | 6/2016 | Nathan | G06F 3/0414 345/174 |
| 2017/0045995 A1 | 2/2017 | Zhao et al. | |

FOREIGN PATENT DOCUMENTS

| | | |
|---|---|---|
| CN | 203444200 U | 2/2014 |
| CN | 104407761 A | 3/2015 |
| CN | 204361102 U | 5/2015 |
| CN | 205038626 U | 2/2016 |

\* cited by examiner

IN-CELL TOUCH PANEL, METHOD FOR DRIVING THE SAME, AND DISPLAY DEVICE

CROSS-REFERENCE TO RELATED APPLICATIONS

This application is the U.S. national phase of PCT Application No. PCT/CN2016/094144 filed on Aug. 9, 2016, which claims priority to Chinese Patent Application No. 201510702597.9 filed on Oct. 26, 2016, the disclosures of which are incorporated in their entirety by reference herein.

TECHNICAL FIELD

The present disclosure relates to the field of display technology, in particular to an in-cell touch panel, a method for driving the same, and a display device.

BACKGROUND

Pressure sensing technology refers to a technology for detecting an external force, and it has long been applied to such fields as industrial control and medical treatment. Currently, in the field of display, especially a mobile phone or flat-panel computer, an additional mechanism may be provided on a backlight portion of a liquid crystal display panel or a middle-frame of the mobile phone, so as to sense a pressure. For such a design, it is necessary to change a structure of the liquid crystal display panel or the mobile phone, and due to a large assembling tolerance, sensing accuracy of this design may be limited.

Hence, there is an urgent need to sense the pressure at high accuracy in the case of few changes in hardware of the display panel.

SUMMARY

An object of the present disclosure is to provide an in-cell touch panel, a method for driving the same, and a display device, so as to enable a plurality of first electrode plates to be multiplexed as a pressure detection electrode, thereby to achieve a pressure-sensing touch function at better sensing accuracy through the pressure detection electrode and a conductive layer under a base substrate, reduce the assembling tolerance and simplify the manufacture process.

To achieve the above object, an in-cell touch panel is provided, including a base substrate, an opposite substrate arranged opposite to the base substrate, a plurality of organic light-emitting pixel units arranged in a matrix form at a side of the base substrate facing the opposite substrate, and pixel circuits arranged between the plurality of organic light-emitting pixel units and the base substrate and corresponding to the organic light-emitting pixel units. The pixel circuits at least includes storage capacitors consisting of a plurality of first electrode plates and a plurality of second electrode plates arranged sequentially on the base substrate. The first electrode plates are divided into groups, and each group of the first electrode plates is multiplexed as a pressure detection electrode, and the in-cell touch panel further includes a plurality of pressure detection electrodes which forms a capacitor with a conductive layer under the base substrate. The in-cell touch panel further includes a pressure detection chip configured to apply a pressure detection signal to each pressure detection electrode at a pressure-sensing touch stage and determine a size of a pressure at a touch position by detecting a change in a capacitance between the pressure detection electrode and the conductive layer.

Optionally, areas of the pressure detection electrodes on the base substrate increase gradually in a direction from a center region of the base substrate to a peripheral region of the base substrate.

Optionally, the in-cell touch panel further includes wires arranged in one-to-one correspondence with the pressure detection electrodes, and connection points arranged in one-to-one correspondence with the pressure detection electrodes. The connection points are arranged at a peripheral region of the in-cell touch panel surrounding a display region. The pressure detection electrodes are electrically connected to the respective connection points through the respective wires, and the respective connection points are electrically connected to the pressure detection chip through metal wires arranged in one-to-one correspondence with the respective connection points and arranged at the peripheral region, to electrically connect the pressure detection electrodes to the pressure detection chip.

Optionally, the peripheral region includes four lateral edges, the connection points are arranged evenly at one of the lateral edges of the four peripheral region; or the connection points are arranged at the four lateral edges of the peripheral region, and each connection point corresponding to one of the pressure detection electrodes is arranged at the lateral edge of the peripheral region closest to the pressure detection electrode.

Optionally, the in-cell touch panel further includes a black matrix layer arranged between the base substrate and the opposite substrate, and an orthogonal projection of each wire onto the base substrate is located within a region of an orthogonal projection of the black matrix layer onto the base substrate.

Optionally, the wires and the pressure detection electrodes are arranged at an identical layer.

Optionally, each organic light-emitting pixel unit includes an anode layer, a light-emitting layer and a cathode layer arranged sequentially on the base substrate. The cathode layer is divided into a plurality of self-capacitive electrodes arranged independent of each other. The in-cell touch panel further includes a capacitance detection chip configured to apply a capacitance detection signal to each self-capacitive electrode at a capacitive touch stage and determine a touch position by detecting a change in a capacitance of the self-capacitive electrode.

A display device is further provided in the present disclosure, including an in-cell touch panel. The in-cell touch panel includes a base substrate, an opposite substrate arranged opposite to the base substrate, a plurality of organic light-emitting pixel units arranged in a matrix form at a side of the base substrate facing the opposite substrate, and pixel circuits arranged between the plurality of organic light-emitting pixel units and the base substrate and corresponding to the organic light-emitting pixel units. The pixel circuits at least includes storage capacitors consisting of a plurality of first electrode plates and a plurality of second electrode plates arranged sequentially on the base substrate. The first electrode plates are divided into groups, and each group of the first electrode plates is multiplexed as a pressure detection electrode, and the in-cell touch panel further includes a plurality of pressure detection electrodes which forms a capacitor with a conductive layer under the base substrate. The in-cell touch panel further includes a pressure detection chip configured to apply a pressure detection signal to each pressure detection electrode at a pressure-sensing touch stage, and determine a size of a pressure at a touch position by detecting a change in a capacitance between the pressure detection electrode and the conductive layer.

Optionally, each organic light-emitting pixel unit includes an anode layer, a light-emitting layer and a cathode layer arranged sequentially on the base substrate. The cathode layer is divided into a plurality of self-capacitive electrodes arranged independent of each other. The in-cell touch panel further includes a capacitance detection chip configured to apply a capacitance detection signal to each self-capacitive electrode at a capacitive touch stage and determine a touch position by detecting a change in a capacitance of the self-capacitive electrode.

Optionally, areas of the pressure detection electrodes on the base substrate increase gradually in a direction from a center region of the base substrate to a peripheral region of the base substrate.

Optionally, the in-cell touch panel further includes wires arranged in one-to-one correspondence with the pressure detection electrodes, and connection points arranged in one-to-one correspondence with the pressure detection electrodes. The connection points are arranged at a peripheral region of the in-cell touch panel surrounding a display region. The pressure detection electrodes are electrically connected to the respective connection points through the respective wires, and the respective connection points are electrically connected to the pressure detection chip through metal wires arranged in one-to-one correspondence with the respective connection points and arranged at the peripheral region, to electrically connect the pressure detection electrodes to the pressure detection chip.

Optionally, the peripheral region includes four lateral edges, and the connection points are arranged evenly at one of the four lateral edges of the peripheral region.

Optionally, the peripheral region includes four lateral edges, the connection points are arranged at the four lateral edges of the peripheral region, and each connection point corresponding to one of the pressure detection electrodes is arranged at the lateral edge of the peripheral region closest to the pressure detection electrode.

Optionally, the in-cell touch panel further includes a black matrix layer arranged between the base substrate and the opposite substrate, and an orthogonal projection of each wire onto the base substrate is located within a region of an orthogonal projection of the black matrix layer onto the base substrate.

Optionally, the conductive layer is a back plate configured to support the in-cell-touch panel.

A method for driving the above-mentioned in-cell touch panel is further provided, where a frame period includes a display stage and a pressure-sensing touch stage, and the method includes at the pressure-sensing stage within the frame period, applying by the pressure detection chip a pressure detection signal to each pressure detection electrode, and determining a size of a pressure at a touch position by detecting a change in a capacitance between the pressure detection electrode and the conductive layer.

Optionally, the frame period further includes a capacitive touch stage, and the method further includes: at the capacitive touch stage within the frame period, applying by the capacitance detection chip a capacitive detection signal to each self-capacitive electrode, and determining a touch position by detecting a change in a capacitance of the self-capacitive electrode.

Optionally, the organic light-emitting pixel units are disenabled to emit light at the pressure-sensing touch stage within the frame period.

Optionally, the method further includes applying the capacitive detection signal to a ground electrode corresponding to the self-capacitive electrode.

According to the in-cell touch panel, the method for driving the same and the display device, the in-cell touch panel includes the base substrate, the opposite substrate arranged opposite to the base substrate, the plurality of organic light-emitting pixel units arranged in a matrix form at a side of the base substrate facing the opposite substrate, and the pixel circuit arranged between the plurality of organic light-emitting pixel units and the base substrate and corresponding to the organic light-emitting pixel units. The pixel circuit at least includes the storage capacitor consisting of the plurality of first electrode plates and the plurality of second electrode plates arranged sequentially on the base substrate. The adjacent first electrode plates are multiplexed as a pressure detection electrode, and the in-cell touch panel further includes a plurality of pressure detection electrodes which form a capacitor with the conductive layer under the base substrate. In the case that one of the pressure detection electrodes is pressed, a distance between the pressure detection electrode and the conductive layer may change, resulting in a change of a capacitance therebetween. Through the pressure detection chip, it is able to apply the pressure detection signal to the pressure detection electrode at the pressure-sensing touch stage, and determine the size of the pressure at the touch position by detecting a change in the capacitance between the pressure detection electrode and the conductive layer, thereby to achieve a pressure-sensing touch function. As compared with the related art, the plurality of first electrode plates for the conventional organic light-emitting display panel is multiplexed as a pressure detection electrode, and the pressure-sensing touch function is achieved through the pressure detection electrode and the conductive layer under the base substrate. As a result, it is able to provide the display device with few changes in its structure, reduce the assembling tolerance, improve the detection accuracy and reduce the manufacture cost.

DETAILED DESCRIPTION

The in-cell touch panel, the method for driving the same and the display device of the present disclosure will be described hereinafter in conjunction with the drawings and embodiments.

A thickness and a shape of each layer in the drawings are for illustrative purposes only, but shall not be construed as reflecting an actual scale.

Figure 1:
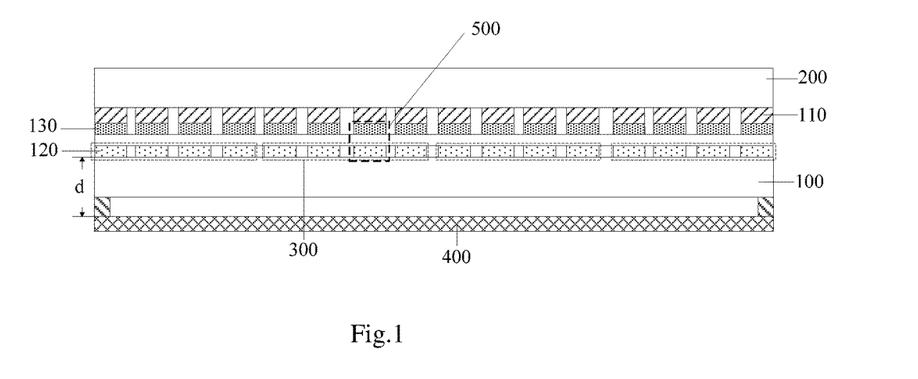
FIG. 1 is a top view of an in-cell touch panel in some embodiments of the present disclosure.
Figure 2A:
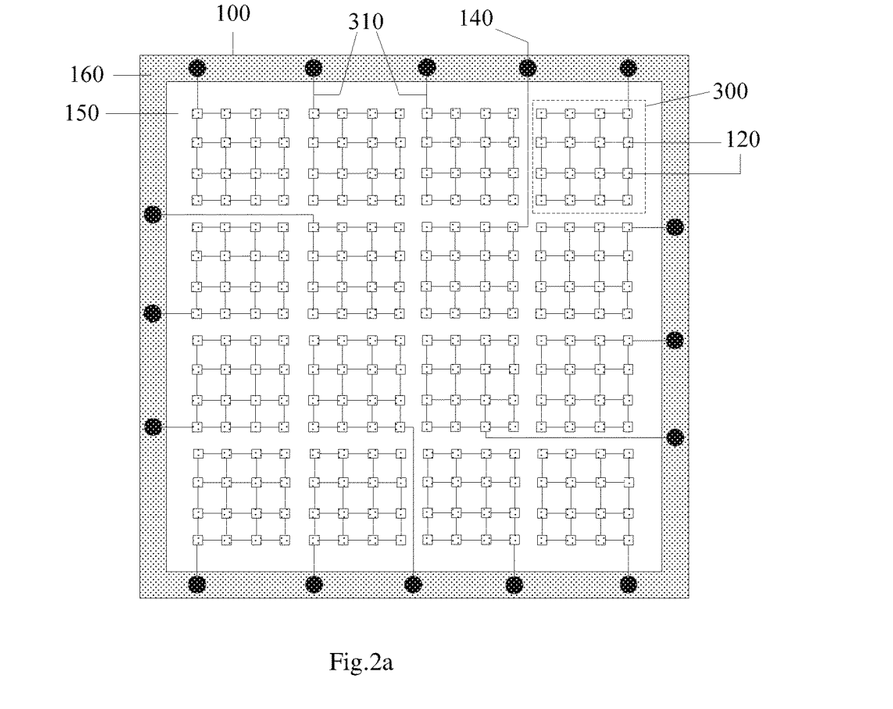
FIG. 2a is a sectional view of an in-cell touch panel in some embodiments of the present disclosure.
Figure 2B:
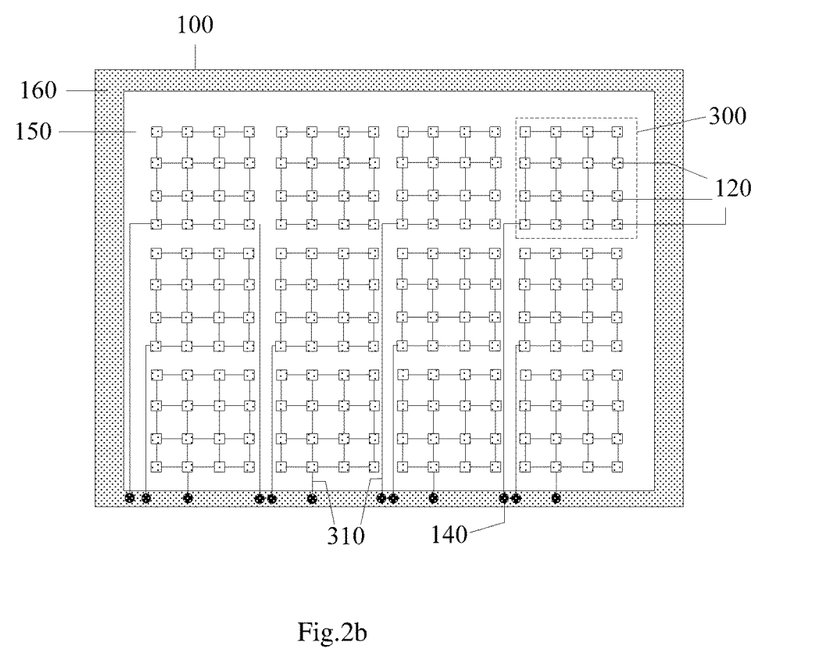
FIG. 2b is a sectional view of an in-cell touch panel in some embodiments of the present disclosure.

The present disclosure provides in some embodiments an in-cell touch panel which, as shown in FIGS. 1 to 2b, includes a base substrate 100, an opposite substrate 200 arranged opposite to the base substrate 100, a plurality of organic light-emitting pixel units 110 arranged in a matrix form at a side of the base substrate 100 facing the opposite substrate 200, and pixel circuits 500 arranged between the plurality of organic light-emitting pixel units 110 and the base substrate 100 and corresponding to the organic light-emitting pixel units 110. The pixel circuits 500 at least include storage capacitors consisting of a plurality of first electrode plates 120 and a plurality of second electrode plates 130 arranged sequentially on the base substrate 100. The first electrode plates 120 are divided into groups, and each group of the first electrode plates is multiplexed as a pressure detection electrode 300, and the in-cell touch panel further includes a plurality of pressure detection electrodes 300 which forms a capacitor with a conductive layer 400 under the base substrate 100. The in-cell touch panel further includes a pressure detection chip configured to apply a pressure detection signal to each pressure detection electrode 300 at a pressure-sensing touch stage and determine a size of a pressure at a touch position by detecting a change in a capacitance between the pressure detection electrode 300 and the conductive layer 400.

According to the embodiments of the present disclosure, the in-cell touch panel includes the base substrate, the opposite substrate arranged opposite to the base substrate, the plurality of organic light-emitting pixel units arranged in a matrix form at a side of the base substrate facing the opposite substrate, and the pixel circuits arranged between the plurality of organic light-emitting pixel units and the base substrate and corresponding to the organic light-emitting pixel units. The pixel circuits at least include the storage capacitors consisting of the plurality of first electrode plates and the plurality of second electrode plates arranged sequentially on the base substrate. The first electrode plates are divided into groups, and each group of the first electrode plates is multiplexed as a pressure detection electrode, and the in-cell touch panel further includes a plurality of pressure detection electrodes which forms a capacitor with the conductive layer under the base substrate. In the case that one of the pressure detection electrodes is pressed, a distance between the pressure detection electrode and the conductive layer may change, resulting in a change of a capacitance therebetween. Through the pressure detection chip, it is able to apply the pressure detection signal to the pressure detection electrode at the pressure-sensing touch stage, and determine the size of the pressure at the touch position by detecting a change in the capacitance between the pressure detection electrode and the conductive layer, thereby to achieve a pressure-sensing touch function. As compared with the related art, the plurality of first electrode plates of the organic light-emitting display panel is multiplexed as a pressure detection electrode, and the pressure-sensing touch function is achieved through the pressure detection electrode and the conductive layer under the base substrate. As a result, it is able to provide the display device with few changes in its structure, reduce the assembling tolerance, improve the detection accuracy and reduce the manufacture cost.

It should be appreciated that, in some embodiments of the present disclosure, each organic light-emitting pixel unit includes an anode layer, a light-emitting layer and a cathode layer arranged sequentially on the base substrate. In addition, each pixel unit is of a top-emission type, i.e., light is emitted from the cathode layer of the organic light-emitting pixel unit.

To be specific, as shown in FIG. 1, a distance between each pressure detection electrode 300 and the conductive layer 400 which together form the capacitor is d. The capacitance may be calculated using an equation $C=\in S/4\pi kd$, where C presents a capacitance of the capacitor formed between the pressure detection electrode 300 and the conductive layer 400, $\in$ represents a dielectric constant of an insulating electrolyte at the distance d, S represents an overlapping area between the pressure detection electrode 300 and the conductive layer 400, k represents a static constant, and d represents the distance between the pressure detection electrode 300 and the conductive layer 400. In the case that one of the pressure detection electrodes 300 is pressed, the distance d may decrease, and a capacitance of the capacitor formed between the pressure detection electrode 300 and the conductive layer 400 may increase. As a result, it is able to determine the size of the pressure by detecting the change in the capacitance.

Figure 3:
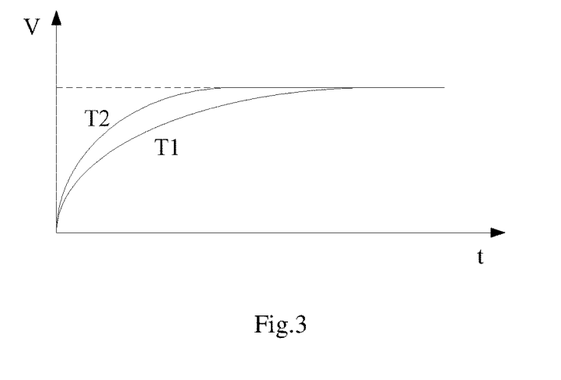
FIG. 3 is a curve diagram showing the relationship between a charging time and a voltage of a pressure detection electrode in an in-cell touch panel in some embodiments of the present disclosure.

Further, the capacitor may be charged using the following equation: $Vt=V0+(Vu-V0)*[1-\exp(-t/RC)]$, where Vt represents a voltage across the capacitor at time t, V0 represents an initial voltage across the capacitor, Vu represents an upper-limit voltage across the capacitor after the capacitor is charged fully, and RC represents a time constant for a resistance-capacitance (RC) circuit. For the capacitor formed between the pressure detection electrode and the conductive layer, its capacitance may vary along with different pressures applied to the pressure detection electrode, and thereby the charging time for the capacitor may vary too. The pressure detection chip may be configured to detect a change in the capacitance by detecting a difference in the charging time, so as to determine a size of the pressure. To be specific, at a touch-sensing detection stage, the pressure detection chip may be configured to apply a pressure detection signal to the pressure detection electrode, so as to enable the capacitor formed between the pressure detection electrode and the conductive layer to generate a coupling capacitance. As shown in FIG. 3 (where a horizontal axis represents time t and a longitudinal axis represents a voltage V across the capacitor), the charging time for the capacitor is T1 in the case of no pressure. In the case that a pressure is applied, the distance between the pressure detection electrode and the conductive layer may decrease. At this time, due to RC delay effect of the signal, the capacitance C of the capacitor may increase and the corresponding charging time may be prolonger to T2. Hence, the pressure detection chip may be configured to detect a change in the charging time for the capacitor formed between the pressure detection electrode and the conductive layer, so as to indirectly determine the size of the pressure at the touch position, thereby to achieve the pressure-sensing touch function.

To be specific, the plurality of first electrode plates of the pixel circuit corresponding to the organic light-emitting pixel unit serves as one pressure detection electrode, so in the embodiments of the present disclosure, the pixel circuit needs to be driven in a time-division manner at the display stage and the pressure-sensing touch stage, so as to prevent the mutual interference at the display stage and the pressure-sensing touch stage. In addition, in some embodiments of the present disclosure, a display driver chip for display and the pressure detection chip may be integrated into one piece, so as to further reduce the manufacture cost.

Further, for the in-cell touch panel, usually a bezel region surrounding a display region is fixed onto an outer frame of the display device, so in the case of an identical force is applied to a center region and a peripheral region of the in-cell touch panel, the pressure detection electrode at the center region may convert the pressure into a change in the distance between the pressure detection electrode and the conductive layer in an easier manner, i.e., the center region is more sensitive to the pressure than the peripheral region. Hence, in order to improve the sensing accuracy at the entire display region of the in-cell touch panel, in some embodiments of the present disclosure, areas of the pressure detection electrodes on the base substrate increase gradually in a direction from the center region of the base substrate to the peripheral region. In this way, at the peripheral region of the in-cell touch panel with insufficient accuracy, the area of the pressure detection electrode may increase, so as to increase the capacitance of the capacitor between the pressure detection electrode and the conductive layer, thereby to increase the change in the capacitance.

Figure 2C:
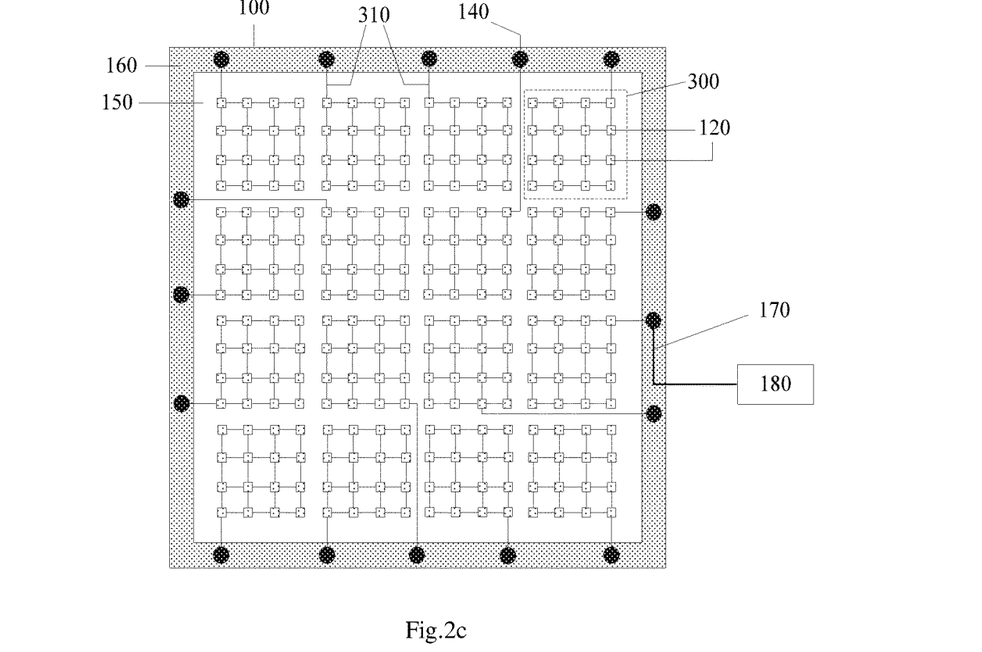
FIG. 2c is a sectional view of an in-cell touch panel in some embodiments of the present disclosure.

Further, usually each pressure detection electrode needs to be electrically connected to the pressure detection chip through a corresponding wire. As shown in FIGS. 2a and 2b, the in-cell touch panel in some embodiments of the present disclosure further includes wires 310 arranged in one-to-one correspondence with the pressure detection electrodes 300, and connection points 140 arranged in one-to-one correspondence with the pressure detection electrodes 300. The connection points 140 are arranged at a peripheral region 160 of the in-cell touch panel surrounding a display region 150. The pressure detection electrodes 300 are connected to the respective connection points 140 through the respective wires 310, the pressure detection electrodes 300 are electrically connected to the pressure detection chip through metal wires arranged in one-to-one correspondence with the respective connection points 140 and arranged at the peripheral region 160. In this way, it is able to electrically connect the pressure detection electrodes to the pressure detection chip, and prevent an aperture ratio of the in-cell touch panel from being adversely affected by the wires and the metal wires. In some embodiments of the present disclosure, the metal wires 170, the pressure detection chip 180 and the connection points 140 may be connected in a manner as shown in FIG. 2c.

Further, in some embodiments of the present disclosure, as shown in FIG. 2a, the peripheral region 160 includes four lateral edges, the connection points 140 are arranged at the four lateral edges of the peripheral region 160, and each connection point 140 corresponding to one of the pressure detection electrodes 300 is arranged at the lateral edge of the peripheral region 160 closest to the pressure detection electrode 300. In this way, it is able to reduce the signal attenuation in the wires, thereby to improve the stability of signal transmission.

Optionally, in some embodiments of the present disclosure, as shown in FIG. 2b, the connection points 140 are arranged evenly at one of the lateral edges of the peripheral region. In this way, it is merely necessary to arrange the wires in one direction, so as to simplify the manufacture process and improve the production efficiency.

In order to ensure the evenness of the light transmittance of the in-cell touch panel in the case of displaying an image, in some embodiments of the present disclosure, the in-cell touch panel further includes a black matrix layer arranged between the base substrate and the opposite substrate, and an orthogonal projection of each wire onto the base substrate is located within a region of an orthogonal projection of the black matrix layer onto the base substrate.

Further, in some embodiments of the present disclosure, the black matrix layer may be arranged at a side of the base substrate facing the opposite substrate, or at a side of the opposite substrate facing the base substrate, which will not be particularly defined herein.

Further, in some embodiments of the present disclosure, the wires and the pressure detection electrodes are arranged at an identical layer. In this way, it is unnecessary to provide any additional process for manufacturing wires, i.e., it is able to form the patterns of the wires and the pressure detection electrodes through a single patterning process, thereby to reduce the manufacture cost.

Figure 2D:
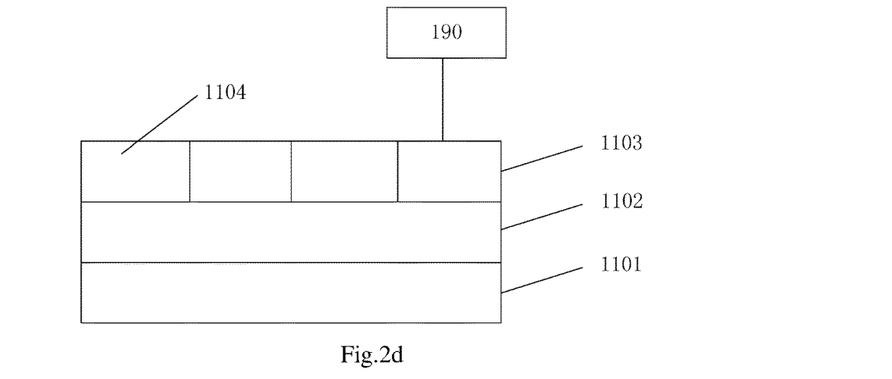
FIG. 2d is a schematic view showing an organic light-emitting pixel unit in an in-cell touch panel in some embodiments of the present disclosure.

Further, as shown in FIG. 2d, the organic light-emitting pixel unit includes an anode layer 1101, a light-emitting layer 1102 and a cathode layer 1103 arranged sequentially on the base substrate. The cathode layer 1103 is divided into a plurality of self-capacitive electrodes 1104 arranged independent of each other. The in-cell touch panel further includes a capacitance detection chip 190 configured to apply a capacitance detection signal to each self-capacitive electrode 1104 at a capacitive touch stage and determine a touch position by detecting a change in a capacitance of the self-capactive electrode. In some embodiments of the present disclosure, the self-capacitive electrode 1104 may be connected to the capacitance detection chip 190 in a manner as shown in FIG. 2d.

To be specific, the cathode layer of the organic light-emitting pixel unit is multiplexed as the self-capacitive electrode, so the display driver chip for display and the capacitance detection chip may be integrated into one piece, so as to further reduce the manufacture cost.

In the embodiments of the present disclosure, the plurality of first electrode plates is divided into groups, and each group of the first electrode plates is multiplexed as the pressured detection electrode, so as to achieve the pressure-sensing touch function. In addition, the cathode layer of the organic light-emitting pixel unit is multiplexed as the self-capacitive electrode, so as to achieve the capacitive touch function. Hence, in some embodiments of the present disclosure, in order to reduce the mutual interference at the display stage, the capacitive touch stage and the pressure-sensing touch stage, it is necessary to drive the pixel driver circuit in a time-division manner at these stages. The capacitance detection signal may be applied by the capacitance detection chip to the self-capacitive electrode at the capacitive touch stage, and the pressure detection signal may be applied by the pressure detection chip to the pressure detection electrode at the pressure-sensing touch stage. Of course, the display driver chip for display, the capacitance detection chip and the pressure detection chip may also be integrated into one piece, so as to further reduce the manufacture cost.

Based on an identical inventive concept, the present disclosure further provides in some embodiments a method for driving the above-mentioned in-cell touch panel. A frame period includes a display stage and a pressure-sensing touch stage. The method includes: at the pressure-sensing stage within one frame period, applying by the pressure detection chip chop pressure detection signal to each pressure detection electrode, and determining a size of a pressure at chop touch position by detecting a change in a capacitance between the pressure detection electrode and the conductive layer.

According to the method in the embodiments of the present disclosure, at the pressure-sensing touch stage, the pressure detection chip may apply the pressure detection signal to the pressure detection electrode, and apply a voltage signal with a fixed value to the conductive layer. At this stage, in the case that the pressure detection electrode is pressed, the distance between the pressure detection electrode and the conductive layer may change, resulting in a change in the capacitance of the capacitor formed therebetween as well as a change in the charging time length for the capacitor. Hence, the pressure detection chip may determine a size of the pressure at the touch position by detecting a change in the charging time length for the capacitance of the capacitor formed between the pressure detection electrode and the conductive layer, thereby to achieve the pressure-sensing touch function.

To be specific, in order to prevent the normal display of the in-cell touch panel from being adversely affected by the input of the pressure detection signal, the organic light-emitting pixel units may be disenabled to emit light at the pressure-sensing touch stage.

Further, the cathode layer of the organic light-emitting pixel unit is multiplexed as the self-capacitive electrode, so in some embodiments of the present disclosure, the frame period may further include a capacitive touch stage, and the method further includes: at the capacitive touch stage, applying by the pressure detection chip a capacitive detection signal to each self-capacitive electrode, and determining the touch position by detecting a change in a capacitance of the self-capacitive electrode.

To be specific, at the capacitive touch stage, the larger the capacitance of the self-capacitive electrode relative to ground electrodes (i.e., the electrodes and signal lines on the base substrate other than the self-capacitive electrode), the lower the accuracy of the capacitive touch may be. Hence, in order to ensure the accuracy of the capacitive touch, at the capacitive touch stage, the capacitance detection chip may not only apply the capacitance detection signal to the self-capacitive electrode, but also apply the same capacitance detection signal to the ground electrode corresponding to the self-capacitive electrode, so that a base capacitance of the self-capacitive electrode may be 0 theoretically.

Figure 4:
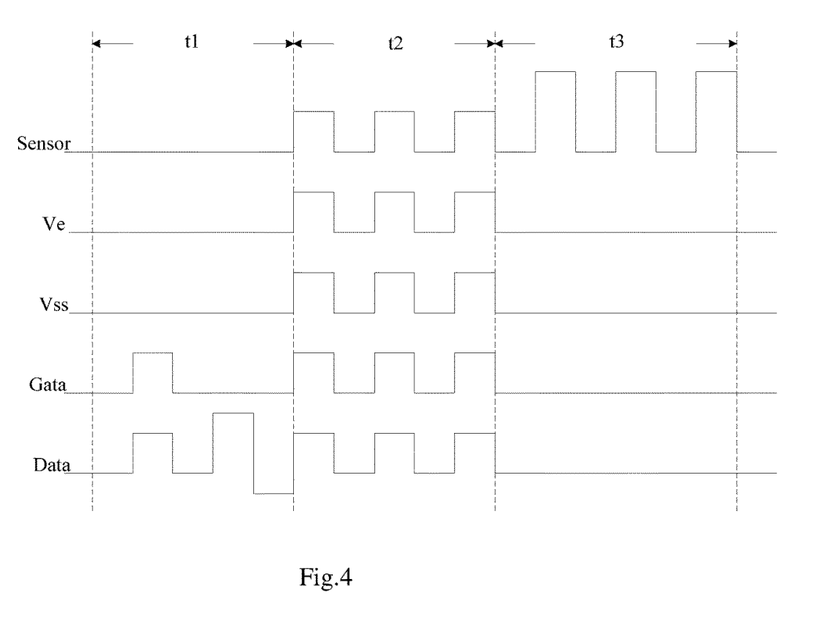
FIG. 4 is a sequence diagram of signals for driving an in-cell touch panel in some embodiments of the present disclosure.

The method will be described hereinafter in conjunction with a sequence diagram within one frame period. FIG. 4 merely shows the time sequence of a signal Sensor applied to the pressure detection electrode, a signal Ve applied to the conductive layer, a signal Vss applied to the self-capacitive electrode, a signal Gate applied to one gate line of the ground electrode corresponding to the self-capacitive electrode, and a signal Data applied to one data line of the ground electrode corresponding to the self-capacitive electrode within one frame period. It should be appreciated that, this sequence diagram is merely for illustrative purposes, but shall not be construed as limiting the present disclosure.

As shown in FIG. 4, each frame period includes the display stage t1, the capacitive touch stage t2 and the pressure-sensing touch stage t3.

At the display stage t1, the signal Sensor applied to the pressure detection electrode, the signal Ve applied to the conductive layer, the signal Vss applied to the cathode layer, the signal Gate applied to the gate line and the signal Data applied to the data line are all signals for displaying an image normally on the in-cell touch panel.

At the capacitive touch stage t2, the signal Vss applied to the self-capacitive electrode, the signal Sensor applied to the pressure detection electrode, the signal Ve applied to the conductive layer, the signal Gate applied to the gate line, and the signal Data applied to the data line are all capacitance detection signals.

At the pressure-sensing touch stage t3, the signal Sensor applied to the pressure detection electrode is the pressure detection signal, and the signal Ve applied to the conductive layer, the signal Vss applied to the cathode layer, the signal Gate applied to the gate line and the signal Data applied to the data line are all voltage signals each with a fixed value.

Based on an identical inventive concept, the present disclosure further provides in some embodiments a display device including the above-mentioned in-cell touch panel. The display device may be any product or member having a display function, such as a mobile phone, a flat-panel computer, a television, a display, a laptop computer, a digital photo frame or a navigator. The other indispensable elements of the display device are known in the art, and thus will not be particularly defined herein. The implementation of the display device may refer to the implementation of the in-cell touch panel, and thus will not be particularly defined herein.

Further, in some embodiments of the present disclosure, the conductive layer is a back plate configured to support the in-cell touch panel. The back plate may be a metallic frame covering an outer edge of the in-cell touch panel, or a metallic sheet attached onto a bottom of the base substrate of the in-cell touch panel, which will not be particularly defined herein. In the case that the in-cell touch panel is applied to a mobile phone, the back plate may also be a middle frame of the mobile phone provided with a conductive material.

According to the in-cell touch panel, its driving method and the display device in the embodiments of the present disclosure, the in-cell touch panel includes the base substrate, the opposite substrate arranged opposite to the base substrate, the plurality of organic light-emitting pixel units arranged in a matrix form at a side of the base substrate facing the opposite substrate, and the pixel circuits arranged between the plurality of organic light-emitting pixel units and the base substrate and corresponding to the organic light-emitting pixel units. The pixel circuits at least include the storage capacitors consisting of the plurality of first electrode plates and the plurality of second electrode plates arranged sequentially on the base substrate. The first electrode plates are divided into groups, and each group of the first electrode plates is multiplexed as a pressure detection electrode, and the in-cell touch panel further includes a plurality of pressure detection electrodes which forms a capacitor with the conductive layer under the base substrate. In the case that one of the pressure detection electrodes is pressed, a distance between the pressure detection electrode and the conductive layer may change, resulting in a change of a capacitance therebetween. Through the pressure detection chip, it is able to apply the pressure detection signal to the pressure detection electrode at the pressure-sensing touch stage and determine the size of the pressure at the touch position by detecting a change in the capacitance between the pressure detection electrode and the conductive layer, thereby to achieve a pressure-sensing touch function. As compared with the related art, the plurality of first electrode plates for the conventional organic light-emitting display panel is multiplexed as a pressure detection electrode, and the pressure-sensing touch function is achieved through the pressure detection electrode and the conductive layer under the base substrate. As a result, it is able to provide the display device with few changes in its structure, reduce the assembling tolerance, improve the detection accuracy and reduce the manufacture cost.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An in-cell touch panel, comprising a base substrate, an opposite substrate arranged opposite to the base substrate, a plurality of organic light-emitting pixel units arranged in a matrix form at a side of the base substrate facing the opposite substrate, and pixel circuits arranged between the plurality of organic light-emitting pixel units and the base substrate and corresponding to the organic light-emitting pixel units,
  wherein the pixel circuits comprise storage capacitors consisting of a plurality of first electrode plates and a plurality of second electrode plates arranged sequentially on the base substrate;
  the adjacent first electrode plates are multiplexed as a pressure detection electrode;
  the in-cell touch panel further comprises a plurality of pressure detection electrodes which forms a capacitor with a conductive layer under the base substrate; and
  the in-cell touch panel further comprises a pressure detection chip configured to apply a pressure detection signal to each pressure detection electrode at a pressure-sensing touch stage and determine a size of a pressure at a touch position by detecting a change in a capacitance between the pressure detection electrode and the conductive layer;
  wherein the in-cell touch panel further comprises wires arranged in one-to-one correspondence with the pressure detection electrodes, and connection points arranged in one-to-one correspondence with the pressure detection electrodes,
  wherein the connection points are arranged at a peripheral region of the in-cell touch panel surrounding a display region; and
  the pressure detection electrodes are electrically connected to the respective connection points through the respective wires, and the respective connection points are electrically connected to the pressure detection chip through metal wires arranged in one-to-one correspondence with the respective connection points and arranged at the peripheral region, to electrically connect the pressure detection electrodes to the pressure detection chip.

2. The in-cell touch panel according to claim 1, wherein areas of the pressure detection electrodes on the base substrate increase gradually in a direction from a center region of the base substrate to a peripheral region of the base substrate.

3. The in-cell touch panel according to claim 1, wherein the peripheral region comprises four lateral edges, and the connection points are arranged evenly at one of the four lateral edges of the peripheral region.

4. The in-cell touch panel according to claim 1, wherein the peripheral region comprises four lateral edges, the connection points are arranged at the four lateral edges of the peripheral region, and each connection point corresponding to one of the pressure detection electrodes is arranged at the lateral edge of the peripheral region closest to the pressure detection electrode.

5. The in-cell touch panel according to claim 1, further comprising a black matrix layer arranged between the base substrate and the opposite substrate, and an orthogonal projection of each wire onto the base substrate is located within a region of an orthogonal projection of the black matrix layer onto the base substrate.

6. The in-cell touch panel according to claim 1, wherein the wires and the pressure detection electrodes are arranged at an identical layer.

7. The in-cell touch panel according to claim 1, wherein each organic light-emitting pixel unit comprises an anode layer, a light-emitting layer and a cathode layer arranged sequentially on the base substrate;
  the cathode layer is divided into a plurality of self-capacitive electrodes arranged independent of each other; and
  the in-cell touch panel further comprises a capacitance detection chip configured to apply a capacitance detection signal to each self-capacitive electrode at a capacitive touch stage and determine a touch position by detecting a change in a capacitance of the self-capacitive electrode.

8. A method for driving the in-cell touch panel according to claim 1, wherein a frame period comprises a display stage and a pressure-sensing touch stage, and the method comprises: at the pressure-sensing stage within the frame period, applying by the pressure detection chip a pressure detection signal to each pressure detection electrode, and determining a size of a pressure at a touch position by detecting a change in a capacitance between the pressure detection electrode and the conductive layer.

9. The method according to claim 8, wherein each organic light-emitting pixel unit comprises an anode layer, a light-emitting layer and a cathode layer arranged sequentially on the base substrate; the cathode layer is divided into a plurality of self-capacitive electrodes arranged independent of each other, and the in-cell touch panel further comprises a capacitance detection chip;
  wherein the frame period further comprises a capacitive touch stage, and the method further comprises: at the capacitive touch stage within the frame period, applying by the capacitance detection chip a capacitive detection signal to each self-capacitive electrode, and determining a touch position by detecting a change in a capacitance of the self-capacitive electrode.

10. The method according to claim 9, further comprising applying the capacitive detection signal to a ground electrode corresponding to the self-capacitive electrode.

11. The method according to claim 8, wherein the organic light-emitting pixel units are disenabled to emit light at the pressure-sensing touch stage within the frame period.

12. A display device, comprising an in-cell touch panel, wherein
  the in-cell touch panel comprises a base substrate, an opposite substrate arranged opposite to the base substrate, a plurality of organic light-emitting pixel units arranged in a matrix form at a side of the base substrate facing the opposite substrate, and pixel circuits arranged between the plurality of organic light-emitting pixel units and the base substrate and corresponding to the organic light-emitting pixel units;
  wherein the pixel circuits comprise storage capacitors consisting of a plurality of first electrode plates and a plurality of second electrode plates arranged sequentially on the base substrate;
  the adjacent first electrode plates are multiplexed as a pressure detection electrode;
  the in-cell touch panel further comprises a plurality of pressure detection electrodes which forms a capacitor with a conductive layer under the base substrate; and the in-cell touch panel further comprises a pressure detection chip configured to apply a pressure detection signal to each pressure detection electrode at a pressure-sensing touch stage and determine a size of a pressure at a touch position by detecting a change in a capacitance between the pressure detection electrode and the conductive layer;

wherein the in-cell touch panel further comprises wires arranged in one-to-one correspondence with the pressure detection electrodes, and connection points arranged in one-to-one correspondence with the pressure detection electrodes, wherein the connection points are arranged at a peripheral region of the in-cell touch panel surrounding a display region; and the pressure detection electrodes are electrically connected to the respective connection points through the respective wires, and the respective connection points are electrically connected to the pressure detection chip through metal wires arranged in one-to-one correspondence with the respective connection points and arranged at the peripheral region, to electrically connect the pressure detection electrodes to the pressure detection chip.

13. The display device according to claim 12, wherein each organic light-emitting pixel unit comprises an anode layer, a light-emitting layer and a cathode layer arranged sequentially on the base substrate;

the cathode layer is divided into a plurality of self-capacitive electrodes arranged independent of each other; and the in-cell touch panel further comprises a capacitance detection chip configured to apply a capacitance detection signal to each self-capacitive electrode at a capacitive touch stage and determine a touch position by detecting a change in a capacitance of the self-capacitive electrode.

14. The display device according to claim 12, wherein areas of the pressure detection electrodes on the base substrate increase gradually in a direction from a center region of the base substrate to a peripheral region of the base substrate.

15. The display device according to claim 12, wherein the peripheral region comprises four lateral edges, and the connection points are arranged evenly at one of the four lateral edges of the peripheral region.

16. The display device according to claim 12, wherein the peripheral region comprises four lateral edges, the connection points are arranged at the four lateral edges of the peripheral region, and each connection point corresponding to one of the pressure detection electrodes is arranged at the lateral edge of the peripheral region closest to the pressure detection electrode.

17. The display device according to claim 12, further comprising a black matrix layer arranged between the base substrate and the opposite substrate, and an orthogonal projection of each wire onto the base substrate is located within a region of an orthogonal projection of the black matrix layer onto the base substrate.

18. The display device according to claim 12, wherein the conductive layer is a back plate configured to support the in-cell-touch panel.

* * * * *